(12) United States Patent
Goto

(10) Patent No.: US 10,759,620 B2
(45) Date of Patent: Sep. 1, 2020

(54) TAPE FEEDER HOLDING DEVICE

(71) Applicant: FUJI CORPORATION, Chiryu-shi (JP)

(72) Inventor: Mitsuhiro Goto, Ichinomiya (JP)

(73) Assignee: FUJI CORPORATION, Chiryu-shi (JP)

( * ) Notice: Subject to any disclaimer, the term of this patent is extended or adjusted under 35 U.S.C. 154(b) by 90 days.

(21) Appl. No.: 15/510,069

(22) PCT Filed: Sep. 9, 2014

(86) PCT No.: PCT/JP2014/073740
§ 371 (c)(1),
(2) Date: Mar. 9, 2017

(87) PCT Pub. No.: WO2016/038668
PCT Pub. Date: Mar. 17, 2016

(65) Prior Publication Data
US 2017/0297848 A1    Oct. 19, 2017

(51) Int. Cl.
*B65H 16/10* (2006.01)
*B65H 16/02* (2006.01)
(Continued)

(52) U.S. Cl.
CPC ........... *B65H 16/103* (2013.01); *B65H 16/02* (2013.01); *H05K 13/0069* (2013.01);
(Continued)

(58) Field of Classification Search
CPC .. B65H 16/103; B65H 16/02; H05K 13/0069; H05K 13/02; H05K 13/0408; H05K 13/0417
See application file for complete search history.

(56) References Cited

U.S. PATENT DOCUMENTS

| 5,456,001 A | 10/1995 | Mori et al. |
| 2002/0014732 A1* | 2/2002 | Isogai ................ H05K 13/0069 269/21 |

(Continued)

FOREIGN PATENT DOCUMENTS

| JP | 3-29400 A | 2/1991 |
| WO | WO2013/121530 A1 | 8/2013 |

(Continued)

OTHER PUBLICATIONS

International Search Report dated Dec. 9, 2014 in PCT/JP2014/073740 filed Sep. 9, 2014.

(Continued)

*Primary Examiner* — Saul Rodriguez
*Assistant Examiner* — Ashley K Romano
(74) *Attorney, Agent, or Firm* — Oblon, McClelland, Maier & Neustadt, L.L.P.

(57) ABSTRACT

Tape feeder holding device includes slide section on which a tape feeder can be slid, the tape feeder supplying electronic components by feeding tape housing the electronic components in a tape feeding direction; and sliding device configured to slide the tape feeder held in the slide section in the tape feeding direction, the sliding device being capable of sliding the tape feeder to a supply position at which the electronic components can be supplied from the tape feeder. That is, with the tape feeder holding device, a tape feeder is automatically attached to the tape feeder holding device.

7 Claims, 11 Drawing Sheets

(51) Int. Cl.
  *H05K 13/04* (2006.01)
  *H05K 13/02* (2006.01)
  *H05K 13/00* (2006.01)

(52) U.S. Cl.
  CPC ......... *H05K 13/02* (2013.01); *H05K 13/0408* (2013.01); *H05K 13/0417* (2013.01)

(56) References Cited

U.S. PATENT DOCUMENTS

| | | | | |
|---|---|---|---|---|
| 2004/0200578 A1* | 10/2004 | Ju | ...................... | H05K 13/0417 156/765 |
| 2015/0181776 A1 | 6/2015 | Kawaguchi et al. | | |
| 2015/0223371 A1* | 8/2015 | Kanai | ..................... | B65H 20/20 226/76 |
| 2015/0223372 A1* | 8/2015 | Kanai | ..................... | B65H 20/22 242/563 |
| 2015/0223374 A1* | 8/2015 | Nozawa | ............. | H05K 13/0417 29/739 |
| 2015/0282396 A1* | 10/2015 | Kanai | ................ | H05K 13/0417 29/740 |

FOREIGN PATENT DOCUMENTS

| WO | WO 2013/179532 A1 | 12/2013 |
|---|---|---|
| WO | WO2014/049684 A1 | 4/2014 |

OTHER PUBLICATIONS

Extended European Search Report dated Jul. 24, 2017 in European Patent Application No. 14901680.0.
Office Action dated Jul. 31, 2018 in Japanese Patent Application No. 2016-547276 (with unedited computer generated English translation), 8 pages.
Office Action dated Dec. 18, 2019 in corresponding European Patent Application No. 14 901 680.0, 5 pages.

* cited by examiner

TAPE FEEDER HOLDING DEVICE

TECHNICAL FIELD

The present application relates to a tape feeder holding device configured to hold a tape feeder.

BACKGROUND ART

A tape feeder is usually attached to a tape feeder holding device of an electronic component mounting machine such as a mounter, the tape feeder being attached to and removed from the tape feeder holding device when exchanging the type of electronic component, replenishing electronic components, and so on. In the patent literature below technology is disclosed for automatically transferring a tape feeder loaded on a preparation table to a tape feeder holding device.

Patent literature 1: JP-A-H03-029400

BRIEF SUMMARY

Technical Problem

In conventional electronic component mounters, an operator slides a tape feeder to attach the tape feeder to the tape feeder holding device; however, there are cases in which operators roughly attach the tape feeder to the tape feeder holding device. This may damage the connector or the like, meaning that the tape feeder cannot be appropriately attached to the tape feeder holding device. Also, for example, in a case in which a weak operator attaches the tape feeder to the tape feeder holding device, the tape feeder may not be slid all the way to an appropriate position, meaning that the tape feeder is not attached in a state in which electronic components can be supplied from the tape feeder. The present disclosure takes account of such circumstances and an object thereof is to appropriately attach a tape feeder to a tape holding device.

Solution to Problem

To solve the above problems, the tape feeder holding device according to an aspect of the present disclosure includes: a slide section on which a tape feeder can be slid, the tape feeder supplying electronic components by feeding tape housing the electronic components in a tape feeding direction; and a sliding device configured to slide the tape feeder held in the slide section in the tape feeding direction, the sliding device capable of sliding the tape feeder to a supply position at which the electronic components can be supplied from the tape feeder.

Further, with respect to another aspect of the present disclosure, the sliding device is provided with an effector member that slides the tape feeder in the tape feeding direction by contacting the tape feeder held by the slide section.

Further, with respect to another aspect of the present disclosure, the sliding device is provided with an actuator that moves the effector member along the slide section, and the actuator is configured to vary the movement amount of the effector member.

Further, with respect to another aspect of the present disclosure, further provided is a position regulating section configured to position the tape feeder at a specified position on the slide section.

Further, with respect to another aspect of the present disclosure, the sliding device slides the tape feeder positioned by the position regulating section in the tape feeding direction.

Further, with respect to another aspect of the present disclosure, the sliding device is provided with an effector member that slides the tape feeder in the tape feeding direction by contacting the tape feeder held by the slide section, the tape feeder holding device is further provided with an effector member that slides the tape feeder in the tape feeding direction by contacting the tape feeder held by the slide section, and the position regulating section is provided with a stopper configured to regulate the sliding in the tape feeding direction of the tape feeder that is in a state not contacting the effector member.

Further, with respect to another aspect of the present disclosure, the sliding device slides the tape feeder in a state contacting the effector member to the supply position after regulation of the sliding by the stopper has been released.

Further, with respect to another aspect of the present disclosure, further provided is a separation direction sliding device configured to slide the tape feeder positioned at the supply position in a direction separating from the supply position.

Further, with respect to another aspect of the present disclosure, the separation direction sliding device and the sliding device are the same device.

Advantageous Effects

The tape feeder holding device according to an aspect of the present disclosure is provided with a sliding device that slides a tape feeder held by a slide section in the tape feeding direction, the sliding device sliding the tape feeder to a supply position at which electronic components can be supplied from the tape feeder. That is, the tape feeder is automatically attached to the tape feeder holding device. By this, for example, damage to the connector and the like due to an operator roughly attaching the tape feeder to the tape feeder holding device is prevented. Also, for example, even a weak operator is able to attach the tape feeder to the tape feeder holding device reliably.

Further, according to another aspect of the present disclosure, an effector member slides the tape feeder in the tape feeding direction by contacting the tape feeder held by the slide section. By this, the tape feeder is slid suitably.

Further, according to another aspect of the present disclosure, the effector member moves along the slide section by the operation of an actuator. Also, the actuator is able to freely change the movement amount of the effector member. By this, the tape feeder is slide suitably to the supply position.

Further, according to another aspect of the present disclosure, the tape feeder is positioned at a specified position on the slide section by a position regulating section. By this, it is possible for the effector member to appropriately contact the tape feeder positioned at the specified position.

Further, according to another aspect of the present disclosure, the tape feeder positioned by the position regulating section is slid in the tape feeding direction. By this, because the slide amount of the tape feeder to the supply position is regulated, it is possible to appropriately slide the tape feeder to the supply position.

Further, according to another aspect of the present disclosure, the tape feeder is positioned at the specified position by the sliding of the tape feeder in the tape feeding direction being regulated by a stopper. By this, it is possible to appropriately position the tape feeder.

Further, according to another aspect of the present disclosure, the tape feeder is slid to the supply position after being stopped at the specified position by the stopper. By this, because the slide amount of the tape feeder to the supply position is regulated, it is possible to appropriately slide the tape feeder to the supply position.

Further, according to another aspect of the present disclosure, the tape feeder positioned at the supply position is moved in a direction separating from the supply position by a separation direction sliding device. By this, it is possible to easily remove the tape feeder from the tape feeder holding device.

Further, according to another aspect of the present disclosure, the separation direction sliding device and the sliding device are the same device. By this, the construction of the tape feeder holding device is made simple.

DESCRIPTION OF PREFERRED EMBODIMENTS

The following describes in detail referring to the figures an example embodiment of the present disclosure.

Figure 1:
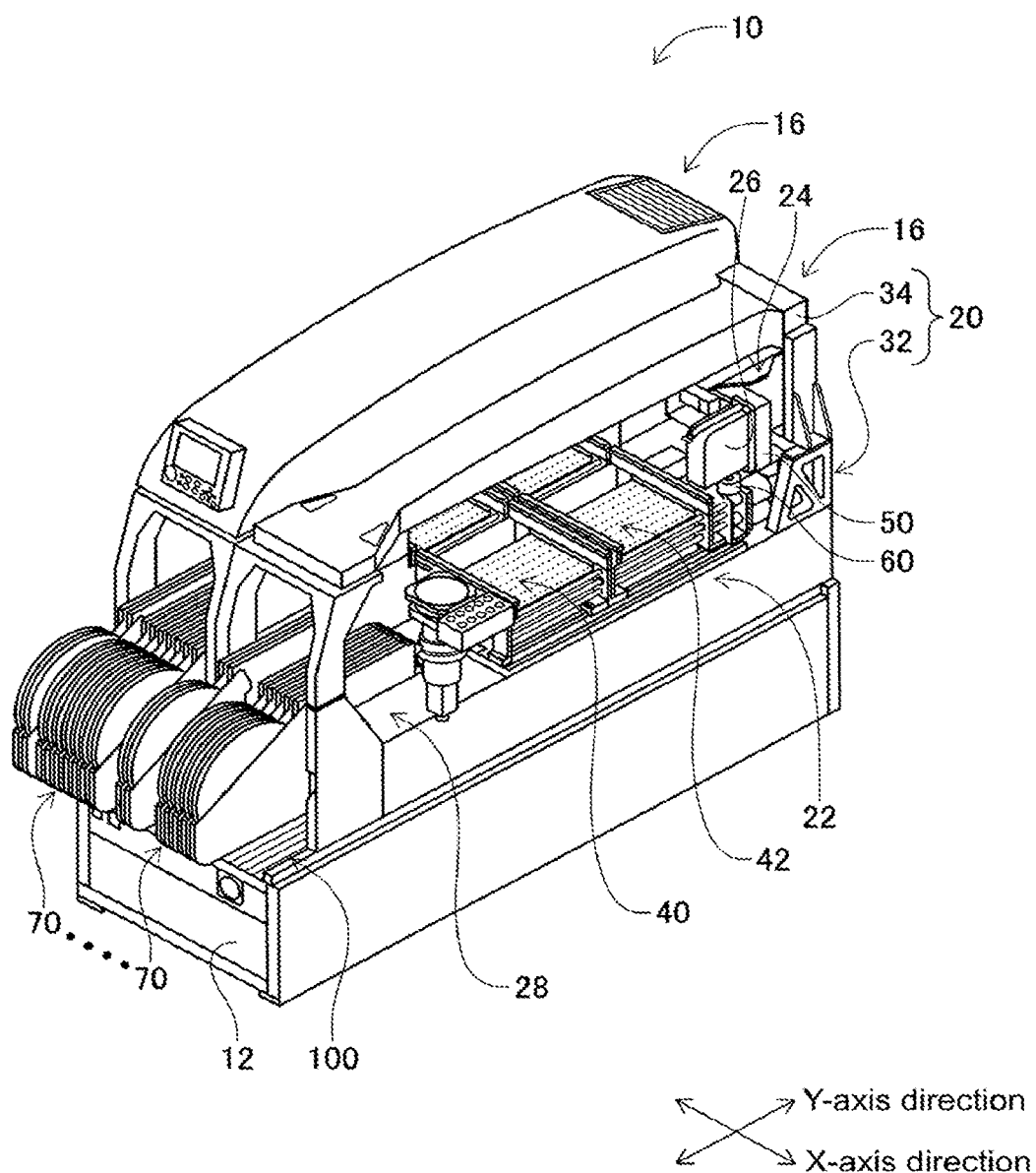
FIG. 1 is a perspective view of an electronic component mounter.

Configuration of electronic component mounting device Electronic component mounting device (hereinafter in some cases abbreviated to "mounting device") 10 is shown in FIG. 1. Mounting device 10 includes one system base 12, and two electronic component mounters (hereinafter in some cases abbreviated to "mounter") 16 provided adjacently to each other on system base 12. Note that, the direction in which the mounters 16 are lined up is referred to as the X-axis direction, and the horizontal direction which is perpendicular to the X-axis direction is referred to as the Y-axis direction.

Each mounter 16 is provided mainly with mounter body 20, conveyance device 22, mounting head moving device (hereinafter in some cases abbreviated to "moving device") 24, mounting head 26, and supply device 28. Mounter body 20 is configured from frame 32 and beam 34 that is mounted on the frame 32.

Conveyance device 22 is provided with two conveyor devices 40 and 42. The two conveyor devices 40 and 42 are parallel to each other and are provided on frame 32 extending in the X-axis direction. Each of the two conveyor devices 40 and 42 conveys a circuit board held on the respective conveyor devices 40 and 42 in the X-axis direction using electromagnetic motor (refer to FIG. 11) 46. Also, the circuit board is fixedly held at a predetermined position by board holding device (refer to FIG. 11) 48.

Moving device 24 is an XY robot type moving device. Moving device 24 is provided with electromagnetic motor (refer to FIG. 11) 52 that slides slider 50 in the X-axis direction, and electromagnetic motor (refer to FIG. 11) 54 that slides slider 50 in the Y-axis direction. Mounting head 26 is attached to slider 50, and the mounting head 26 is moved to any position on frame 32 by the operation of the two electromagnetic motors 52 and 54.

Mounting head 26 mounts electronic components on a circuit board. Suction nozzle 60 is provided on the lower end of mounting head 26. Suction nozzle 60 is connected to a positive/negative pressure supply device (refer to FIG. 11) 62 via a negative pressure air/positive pressure air supply passage. Suction nozzle 60 picks up and holds an electronic component using negative pressure, and releases the held electronic component using positive pressure. Also, mounting head 26 has nozzle raising/lowering device (refer to FIG. 11) 64 that raises/lowers suction nozzle 60. Mounting head 26 changes the vertical position of a held electronic component by nozzle raising/lowering device 64.

Supply device 28 is a feeder type supply device and is provided on the front end of frame 32. Supply device 28 has tape feeders 70. Tape feeders 70 house taped components, which are electronic components housed in tape, in a wound state. Further, tape feeder 70 feeds the taped components using indexing device (refer to FIG. 11) 71. Accordingly, feeder type supply device 28 supplies an electronic component to a supply position by feeding the taped components.

Figure 2:
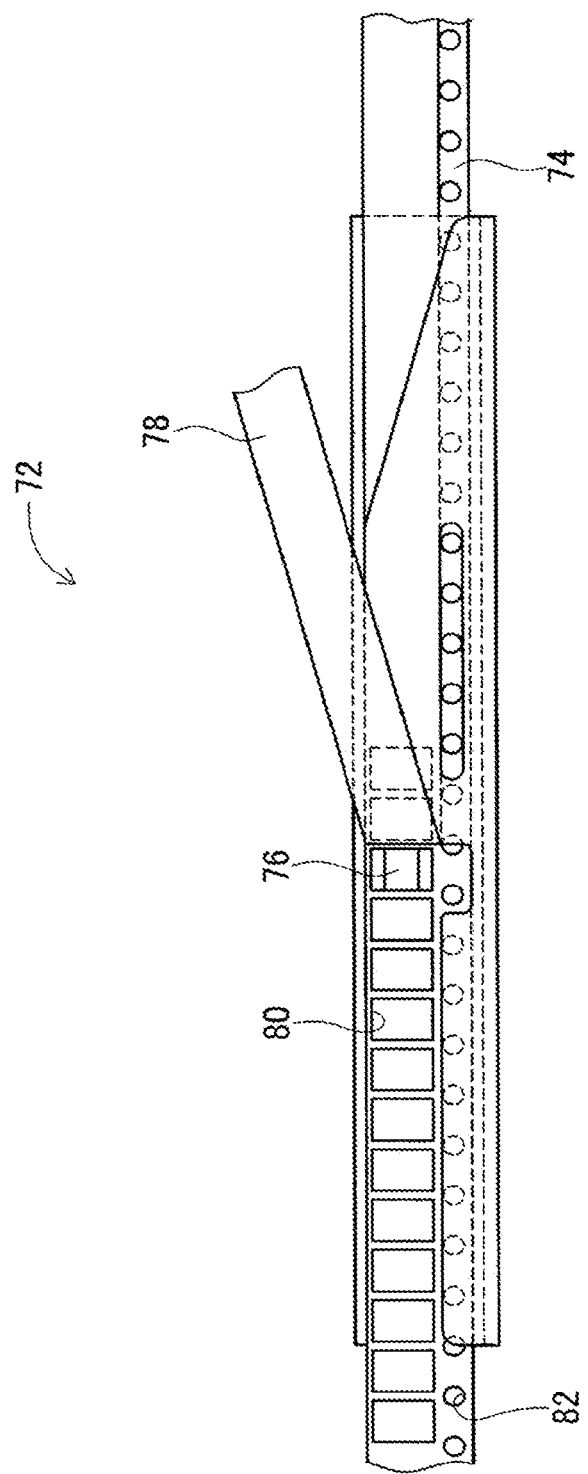
FIG. 2 is a plan view of taped components.

In detail, as shown in FIG. 2, taped components 72 are configured from carrier tape 74, electronic components 76, and top cover tape 78. Many housing cavities 80 and indexing holes 82 are formed at an even pitch on carrier tape 74, and electronic component 76 is housed in each housing cavity 80. Also, housing cavities 80 in which an electronic component 76 is housed are covered by top cover tape 78.

Figure 3:
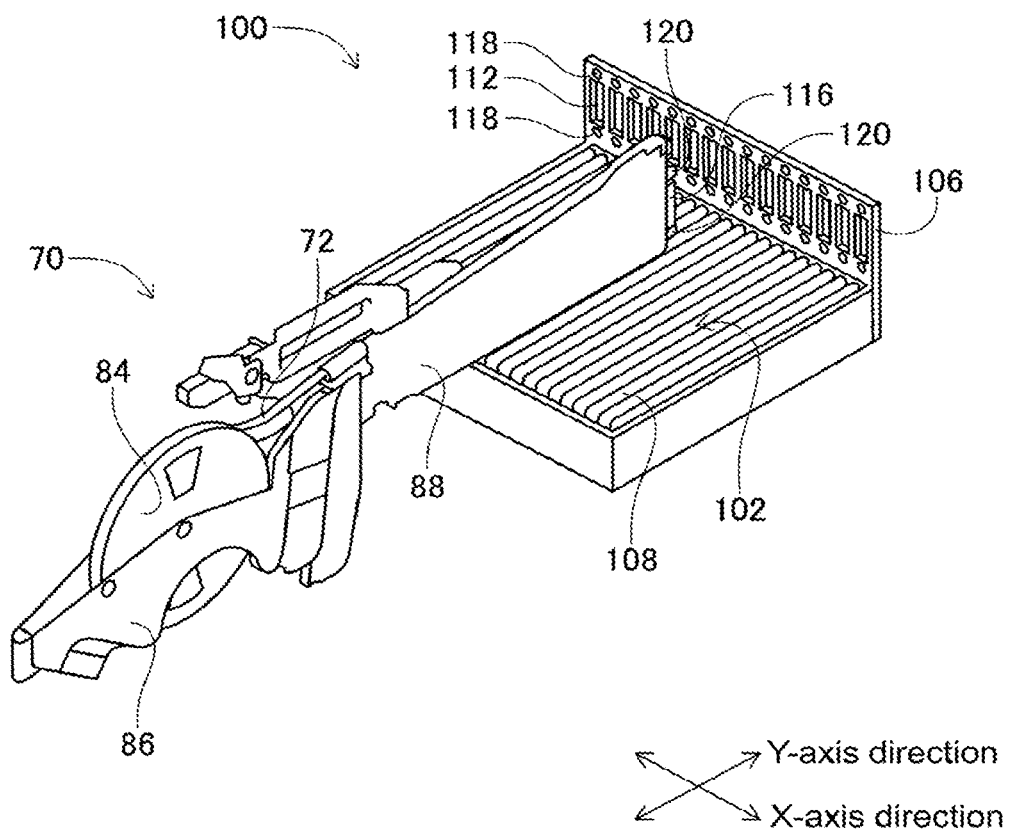
FIG. 3 is a perspective view of a supply device.

Also, as shown in FIG. 3, tape feeder 70 is configured from tape reel 84, reel holding section 86, and feeder main body 88. Taped components 72 are wound on tape reel 84, and reel holding section 86 holds tape reel 84. Taped components 72 are pulled from tape reel 84 held by reel holding section 86, and those taped components 72 are extended on the upper surface of feeder main body 88. The lengthwise direction of the tape feeder, that is, the lengthwise direction of slide groove 108 mentioned later, is the tape feeding direction.

Figure 4:
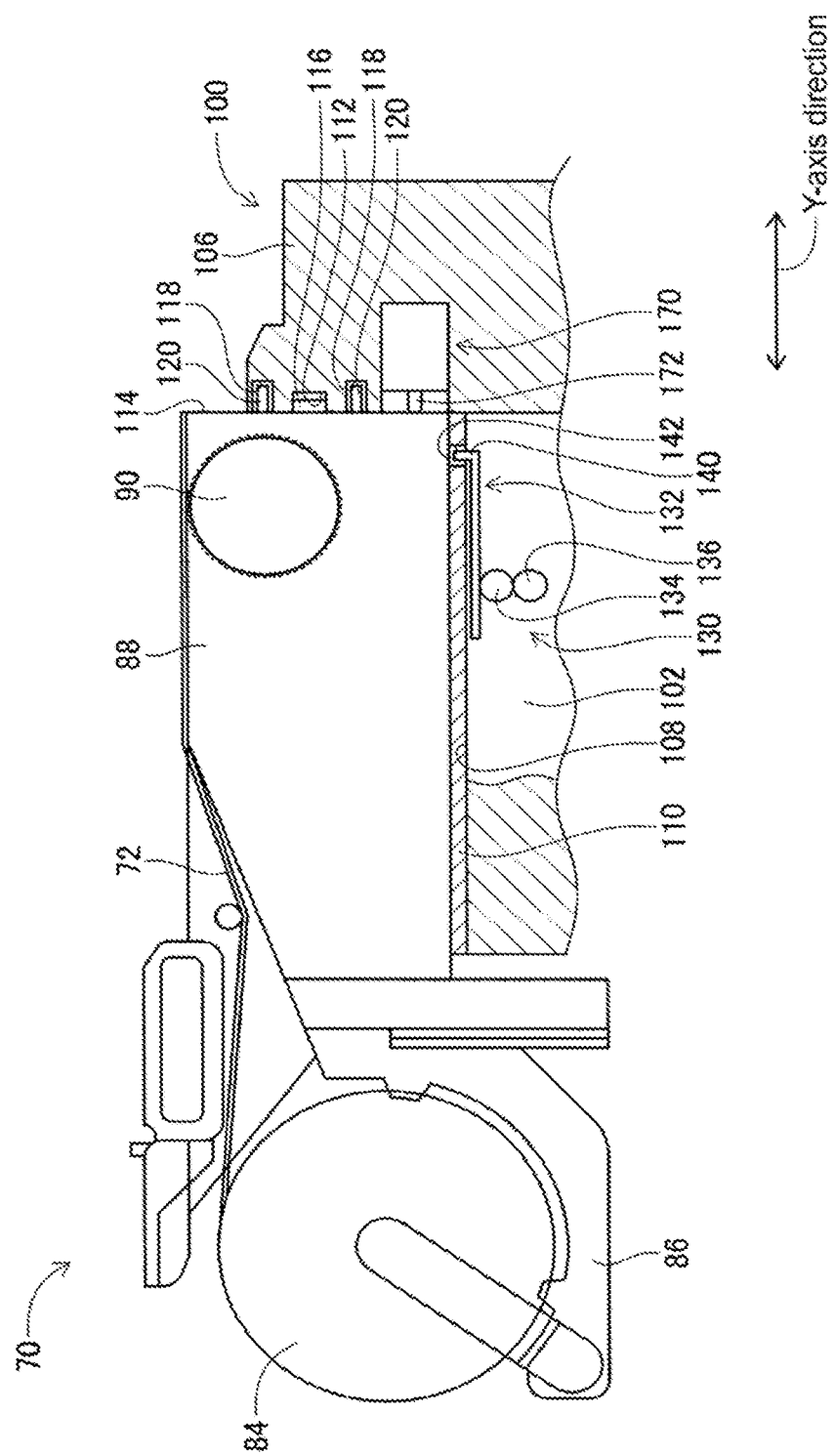
FIG. 4 is a cross section side view showing a tape feeder in a state slid to the supply position.

As shown in FIG. 4, sprocket 90 is provided inside feeder main body 88, and sprocket 90 engages with indexing holes 82 formed in taped components 72. Further, by sprocket 90 being rotated by indexing device 71, taped components 72 are fed in a direction away from tape reel 84 along the top surface of feeder main body 88. Also, top cover tape 78 is peeled from carrier tape 74 of taped components 72 by a peeling device (not shown). By this, the housing cavities 80 of taped components 72 are revealed consecutively at the leading end of the upper surface of feeder main body 88, and electronic component 76 is removed from the revealed housing cavity 80 by suction nozzle 60.

Also, tape feeder 70 can be attached to and removed from tape feeder holding device 100 that is fixedly attached on the end section of the front of frame section 32. Specifically, tape feeder holding device 100 is configured from slide section 102 provided on the upper surface of frame section 32, and vertical surface section 106 established on a side close to conveyance device 22 of that slide section 102. Multiple slide grooves 108 extending in the Y-axis direction are formed on slide section 102. Also, rail 110 is attached to the underside section of feeder main body 88 of tape feeder 70. Further, by rail 110 engaging with slide groove 108, tape feeder 70 is able to slide on the upper surface of slide section 102 towards or away from vertical surface section 106.

Also, connector section 112 is provided in vertical surface section 106. Conversely, connector 116 is provided on side wall surface 114 of tape feeder 70, which is on the opposite side to reel holding section 86. When tape feeder 70 is attached to tape feeder holding device 100, connector 116 is connected to connector section 112. Here, housing cavity 80 exposed on taped components 72 housed in tape feeder 70 is positioned at the supply position on tape feeder holding device 100. Also, a pair of engaging holes 118 is formed on vertical surface section 106 sandwiching connector section 112 in the vertical direction. Conversely, a pair of pins 120 is provided on side wall surface 114 of tape feeder 70 sandwiching connector 116 in the vertical direction. And, when tape feeder 70 is attached to tape feeder holding device 100, the pair of pins 120 engage with the pair of engaging holes 118. Note that, the protrusion amount of pins 120 from side wall surface 114 is larger than the protrusion amount of connector 116 from side wall surface 114.

Further, sliding device 130 for sliding tape feeder 70 in the tape feeding direction is provided on slide section 102 of tape feeder holding device 100. Sliding device 130 is configured from rack 132, pinion gear 134, transmission gear 136, and electromagnetic motor (refer to FIG. 11) 138. Rack 132 is provided below slide groove 108 and is capable of sliding along slide groove 108. Protruding section 140 that protrudes up is formed on the end of the vertical surface section 106 of rack 132, and that protruding section 140 protrudes inside slide groove 108. On the other hand, engaging hole 142 is formed on the lower surface of rail 110 of tape feeder 70. Further, protruding section 140 of rack 132 engages with engaging hole 142 of rail 110 engaged with slide groove 108.

Figure 5:
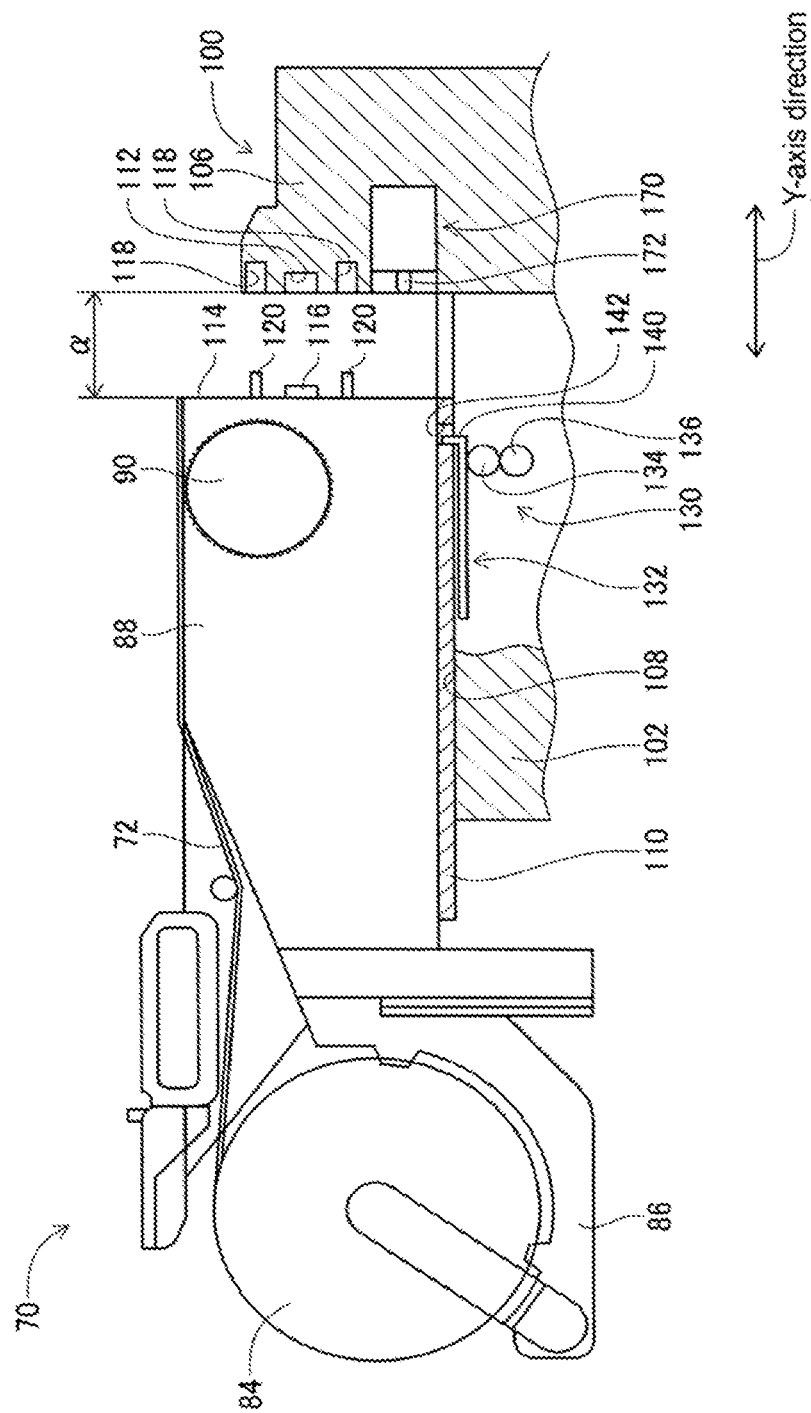
FIG. 5 is a cross section side view showing a tape feeder in a state slid to the removal position.

Further, pinion gear 134 is engaged with rack 132, and transmission gear 136 is engaged with pinion gear 134. Transmission gear 136 rotates by being driven by electromagnetic motor 138. Thus, rack 132 slides along slide groove 108, and tape feeder 70 that engages with protruding section 140 of rack 132 also slides. Note that, electromagnetic motor 138 is a stepping motor that slides tape feeder 70 within a specified range. In detail, tape feeder 70 slides between, as shown in FIG. 4, the position at which side wall surface 114 is attached to vertical surface section 106, that is, the position at which an electronic component is able to be supplied from tape feeder 70 (hereinafter also sometimes referred to as "supply position"), and, as shown in FIG. 5, the position at which side wall surface 114 is separated from vertical surface section 106 by specified distance a (hereinafter also sometimes referred to as "removal position"). Note that, detection sensor (refer to FIG. 11) 148 is provided on slide section 102 of tape feeder holding device 100, and when tape feeder 70 is slid to the removal position, tape feeder 70 is detected by detection sensor 148.

Multiple sliding devices 130 are provided on tape feeder holding device 100 corresponding to the multiple slide grooves 108, and a tape feeder 70 slides at each slide groove 108 due to the operation of the sliding device 130 corresponding to the slide groove 108. However, only one electromagnetic motor 138 is provided for multiple sliding devices 130, and multiple sliding devices 130 are individually operated by the single electromagnetic motor 138.

Figure 6:
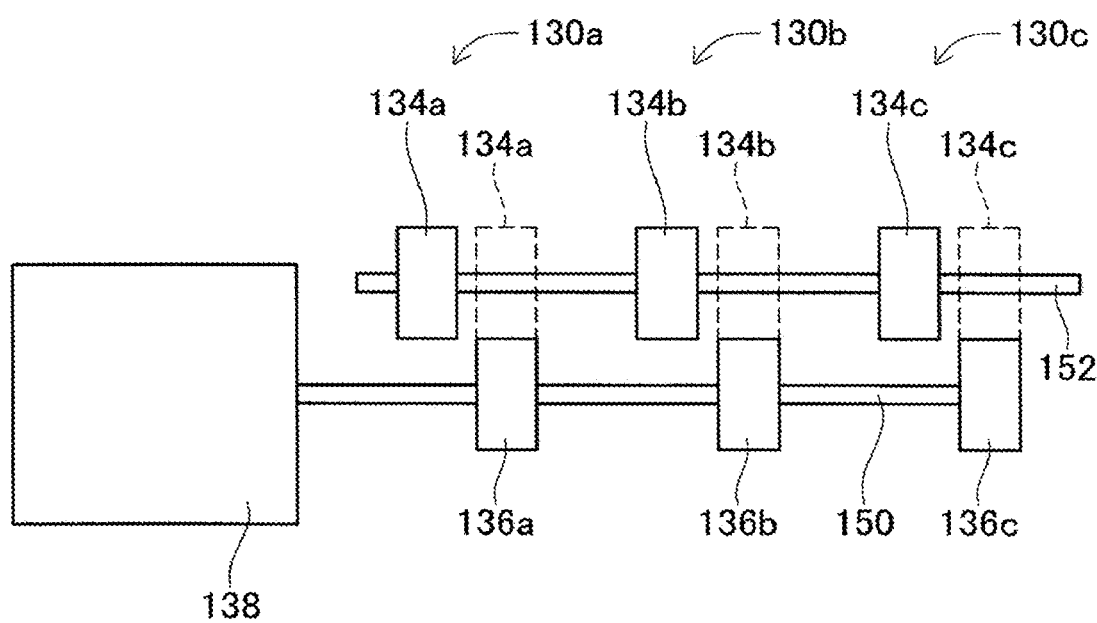
FIG. 6 is a schematic drawing showing the pinion gear, transmission gear, and electromagnetic motor of multiple supply devices.

In detail, as shown in FIG. 6, transmission gears 136a to 136c of multiple sliding devices 130a to 130c (three sliding devices are shown in the figure) are fixed to output shaft 150 of the single electromagnetic motor 138. Support shaft 152 is provided parallel to output shaft 150, and pinion gears 134a to 134c of the multiple sliding devices 130a to 130c are supported by support shaft 152 so as to be rotatable and slidable in the axis direction of support shaft 152. Pinion gears 134a to 134c slide between an engaging position at which they engage with transmission gears 136a to 136c (the position shown by the dotted line pinion gears 134a to 134c in the figure), and a release position at which the engagement with transmission gears 136a to 136c is released (the position shown by the solid line pinion gears 134a to 134c in the figure). With this construction, the pinion gear 134 of the sliding device 130 that is the target for operation among the multiple sliding devices 130a to 130c is slid to the engaging position, and the pinion gears 134 that are not the target for operation are slid to the release position. By this, the driving power of electromagnetic motor 138 is transmitted to only the pinion gear 134 of the sliding device 130 that is the target for operation, such that the sliding device that is the target for operation operates.

Figure 7:
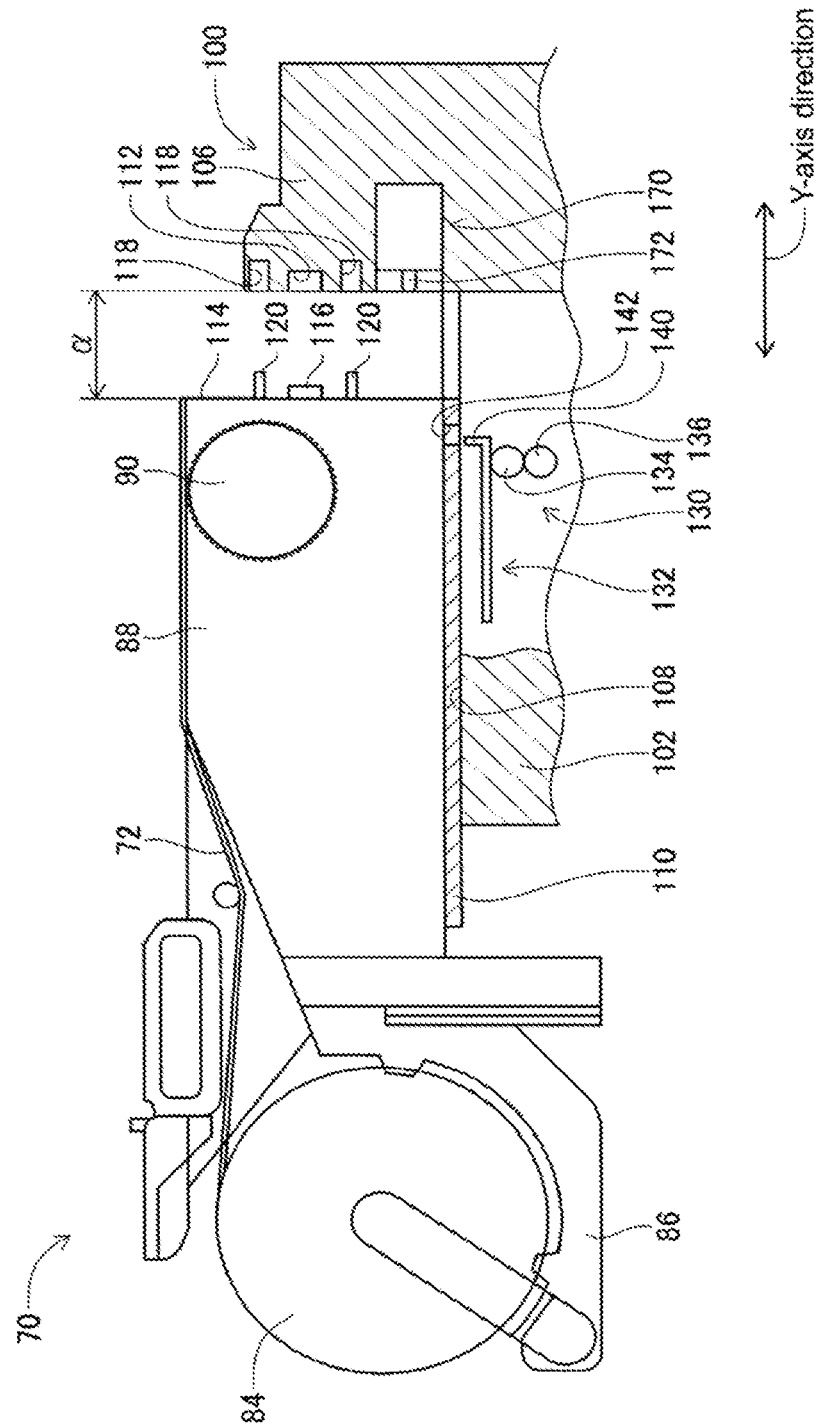
FIG. 7 is a cross section side view of a tape feeder in state with the locking released.

Raising and lowering device (refer to FIG. 11) 160 that individually raises and lowers the multiple sliding devices 130 is provided on slide section 102 of tape feeder holding device 100. As shown in FIG. 5, with sliding device 130 raised by the operation of raising and lowering device 160, protruding section 140 of rack 132 extends into slide groove 108, and engages with engaging hole 142 of tape feeder 70. On the other hand, as shown in FIG. 7, with sliding device 130 lowered by the operation of raising and lowering device 160, protruding section 140 of rack 132 is retracted below slide groove 108, and the engagement with engaging hole 142 of tape feeder 70 is released.

Figure 8:
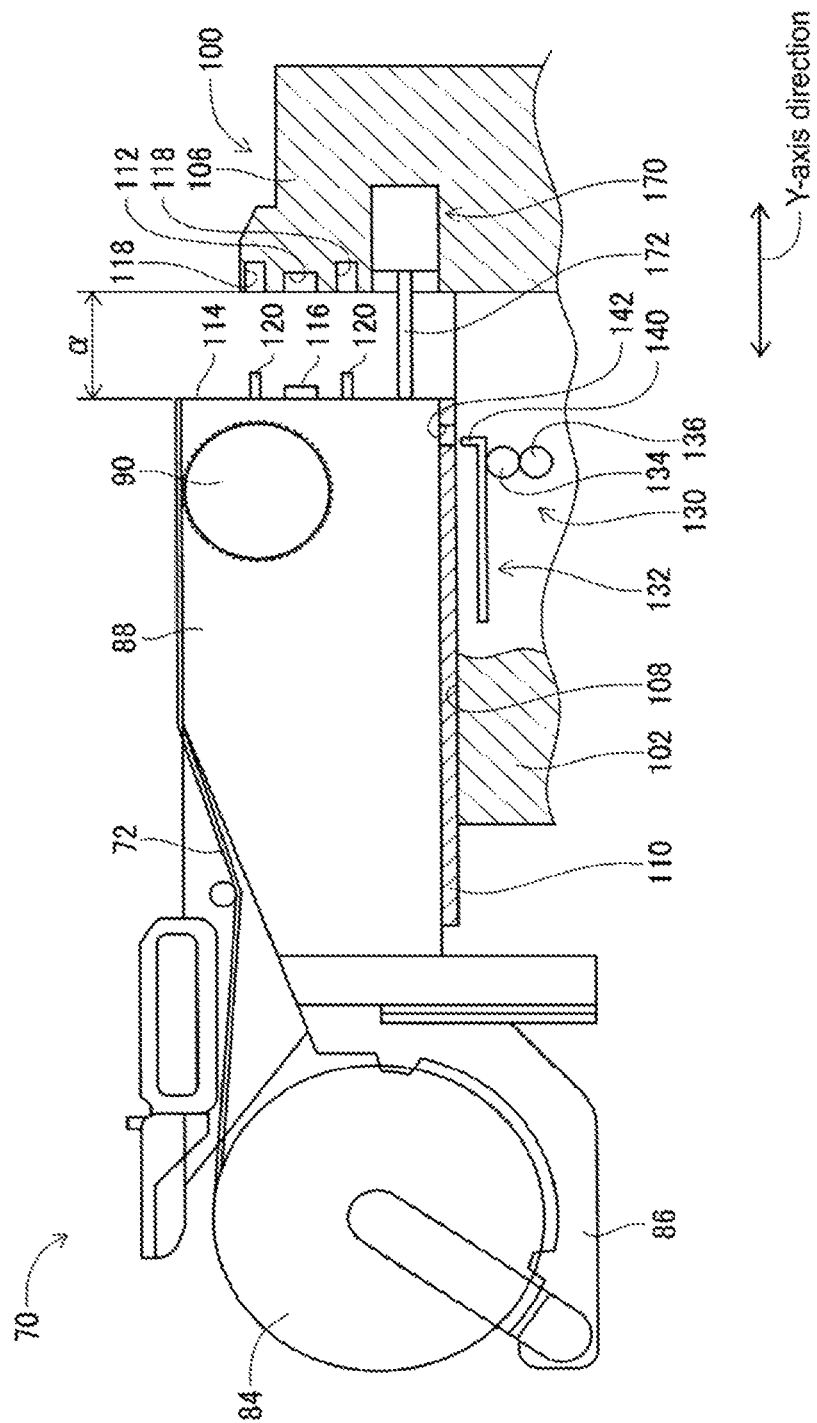
FIG. 8 is a cross section side view showing a tape feeder in a state in which sliding is being regulated by a stopper.

As shown in FIG. 4, solenoid 170 is provided on vertical surface section 106 of tape feeder holding device 100. Solenoid 170 includes solenoid pin 172, and in a demagnetized state solenoid pin 172 is retracted inside vertical surface section 106. However, in an excited state, solenoid pin 172 protrudes towards tape feeder 70 from vertical surface section 106, as shown in FIG. 8. Note that, solenoid pin 172 in an excited state protrudes from vertical surface section 106 by specified distance a.

Figure 9:
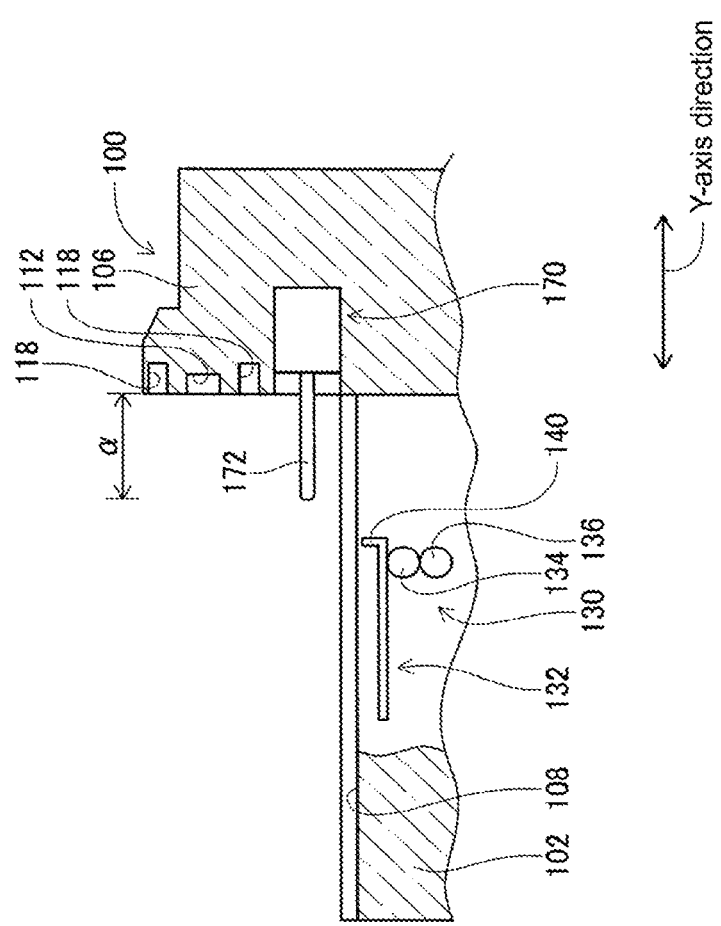
FIG. 9 is a cross section side view showing the tape feeder holding device before a tape feeder is loaded.

According to this construction, with supply device 28, attaching and removal of tape feeder 70 to and from tape feeder holding device 100 is performed automatically. Specifically, as shown in FIG. 9, when tape feeder 70 is attached to tape feeder holding device 100, solenoid 170 is made to be in an excited state such that solenoid pin 172 protrudes by specified distance a from vertical surface section 106. Also, rack 132 is slid in a direction away from vertical surface section 106 by operation of sliding device 130, and sliding device 130 is lowered by operation of raising and lowering device 160. That is, protruding section 140 of rack 132 is retracted below slide groove 108. Then, an operator engages rail 100 with the slide groove 108 such that tape feeder 70 is held by slide section 102, and slides the tape feeder 70 towards vertical surface section 106 (hereinafter also referred to as the "towards direction").

Here, the operator slides tape feeder 70 in the towards direction until side wall surface 114 contacts the tip of solenoid pin 172. By this, as shown in FIG. 8, the tape feeder is slid to the position separated from vertical surface section 106 by specified distance a, that is, the removal position, thereafter the sliding of the tape feeder 70 being regulated by solenoid pin 172. By sliding tape feeder 70 to the removal position, tape feeder 70 is detected by detection sensor 148. When tape feeder 70 is detected by detection sensor 148, sliding section 130 is raised by operation of raising and lowering device 160. By this, as shown in FIG. 5, protruding section 140 of rack 132 protrudes inside slide groove 108 and engages with engaging hole 142 of tape feeder 70. Because tape feeder 70 is positioned at the removal position by solenoid pin 172, the engagement of protruding section 140 with engaging hole 142 is appropriate. Also, when tape feeder 70 is detected by detection sensor 148, solenoid 170 is demagnetized and solenoid pin 172 is retracted inside vertical surface section 106.

Then, by operation of sliding section 130, rack 132 is moved in the towards direction, such that tape feeder 70 is slid towards vertical surface section 106. By this, as shown in FIG. 4, tape feeder 70 is slid to the supply position and side wall section 114 is attached to vertical surface section 106. In other words, the pair of pins 120 engages with the pair of engaging holes 118, tape feeder 70 is positioned, and connector 116 is connected to connector section 112.

Note that, as mentioned above, the protrusion amount of pins 120 from side wall surface 114 is larger than the protrusion amount of connector 116 from side wall surface 114. Thus, after positioning of tape feeder 70 has been performed, connector 116 is connected to connector section 112. Thus, side wall surface 114 is attached to vertical surface section 106 without damage to connector 116 or the like. Also, the rotation speed of electromagnetic motor 38 when tape feeder 70 is slid from the removal position to an intermediate position between the removal position and the supply position is X rpm, and the rotation speed of electromagnetic motor 38 when tape feeder 70 is slid from the intermediate position to the supply position is Y (<X) rpm. That is, the sliding speed of tape feeder 70 from the intermediate position to the supply position is slower than the sliding speed of tape feeder 70 from the removal position to the intermediate position. Thus, it is possible to prevent connector 116 or the like contacting connector section 112 or the like at high speed, thus preventing damage to connector 116 or the like.

In this manner, with supply device 28, because side wall surface 114 is attached to vertical surface section 106 automatically, for example, damage to connector 116 or the like due to an operator roughly attaching tape feeder 70 to tape feeder holding device 100 is prevented. Also, for example, even a weak operator is able to attach tape feeder 70 to tape feeder holding device 100 reliably.

Note that, in a state with side wall surface 114 attached to vertical surface section 106, that is, in a state with tape feeder 70 slid to the supply position, sliding device 130 is maintained in a raised state. By this, for a tape feeder 70 attached to tape feeder holding device 100, protruding section 140 of rack 132 is maintained in an engaged state with engaging hole 142, such that tape feeder 70 is locked on tape feeder holding device 100.

When tape feeder 70 is removed from tape feeder holding device 100, rack 132 is moved a direction away from vertical surface section 106 (hereinafter also sometimes referred to as the "separation direction") by operation of sliding device 130, and side wall surface 114 is removed from vertical surface section 106. That is, connector 116 is removed from connector section 112 and the pair of pins 120 is removed from the pair of engaging holes 118. Then, as shown in FIG. 5, tape feeder 70 is slid to the removal position by operation of sliding device 130. Here, by tape feeder 70 being slid to the removal position, tape feeder 70 is detected by detection sensor 148. When tape feeder 70 is detected by detection sensor 148, sliding section 130 is lowered by operation of raising and lowering device 160. By this, as shown in FIG. 7, protruding section 140 of rack 132 is retracted below slide groove 108 and the engagement of protruding section 140 with engaging hole 142 of tape feeder 70 is released. Then, an operator removes tape feeder 70 from tape feeder holding device 100 by sliding tape feeder 70 in the separation direction.

In this manner, with supply device 28, the attachment of side wall surface 114 to vertical surface section 106 and the removal of side wall surface 114 from vertical surface section 106 is performed automatically. Thus, with supply device 28, when attaching a tape feeder 70 to tape feeder holding device 100 on which multiple tape feeders 70 are loaded adjacently, it is easy to attach and remove tape feeder 70 to and from tape feeder holding device 100, and removal and attachment can be performed favorably.

Specifically, because multiple slide grooves 108 are formed in tape feeder holding device 100, as shown in FIG. 1, multiple tape feeders 70 are attached in an adjacent state. With multiple tape feeders 70 attached to tape feeder holding device 100 adjacently in this manner, there is virtually no gap between two adjacent tape feeders 70, the gap being so narrow that is difficult even to insert one finger. Therefore, it is difficult to attach and remove a tape feeder 70 to and from a tape feeder holding device 100 to which multiple tape feeders 70 are attached. Also, when attaching or removing a tape feeder 70 to or from a tape feeder holding device 100 to which multiple tape feeders 70 are attached, the operator's finger may contact an adjacent tape feeder 70. Thus, for example, when performing exchange of tape feeders 70 during mounting operation, mounting operation may be disrupted by an operator's finger contacting a tape feeder 70 that is not scheduled to be exchanged.

Figure 10:
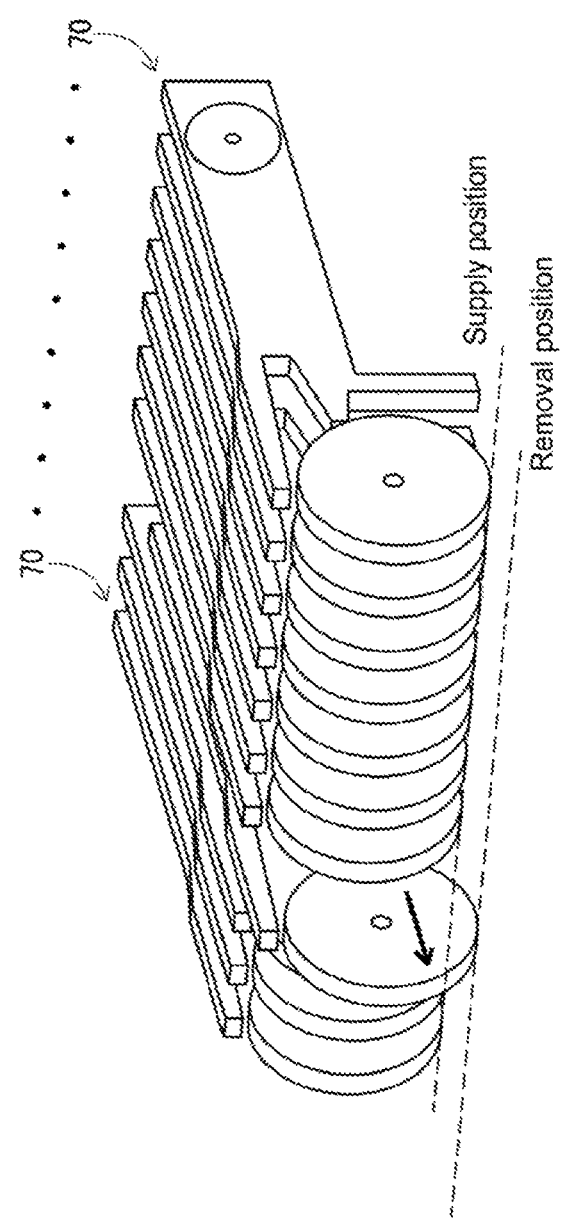
FIG. 10 is a perspective view showing multiple tape feeders attached to the tape feeder holding device adjacent to one other.

However, with supply device 28, when attaching tape feeder 70 to tape feeder holding device 100, as shown in FIG. 10, an operator may cause tape feeder to be held by slide section 102 and slide the tape feeder 70 to the removal position. Then, the tape feeder 70 slid to the removal position is slid from the removal position to the supply position by the operation of sliding device 130 and so on, so as to attach tape feeder 70 to tape feeder holding device 100. Also, when removing tape feeder 70 from tape feeder holding device 100, tape feeder 70 attached to tape feeder holding device 100 is slid from the supply position to the removal position by operation of sliding device 130 and so on. Then, an operator removes the tape feeder 70 slid to the removal position from tape feeder holding device 100 by sliding tape feeder 70 in the separation direction.

In this manner, with supply device 28, tape feeder 70 is slid between the removal position and the supply position by operation of sliding device 130 and so on. Therefore, when attaching and removing tape feeder 70 to and from tape feeder holding device 100, an operator does not have to insert a finger between two adjacent tape feeders 70, thus there is no tendency to contact an adjacent tape feeder 70. Thus, with supply device 28, when attaching a tape feeder 70 to tape feeder holding device 100 on which multiple tape feeders 70 are loaded adjacently, it is easy to attach and remove tape feeder 70 to and from tape feeder holding device 100, and removal and attachment can be performed favorably.

Figure 11:
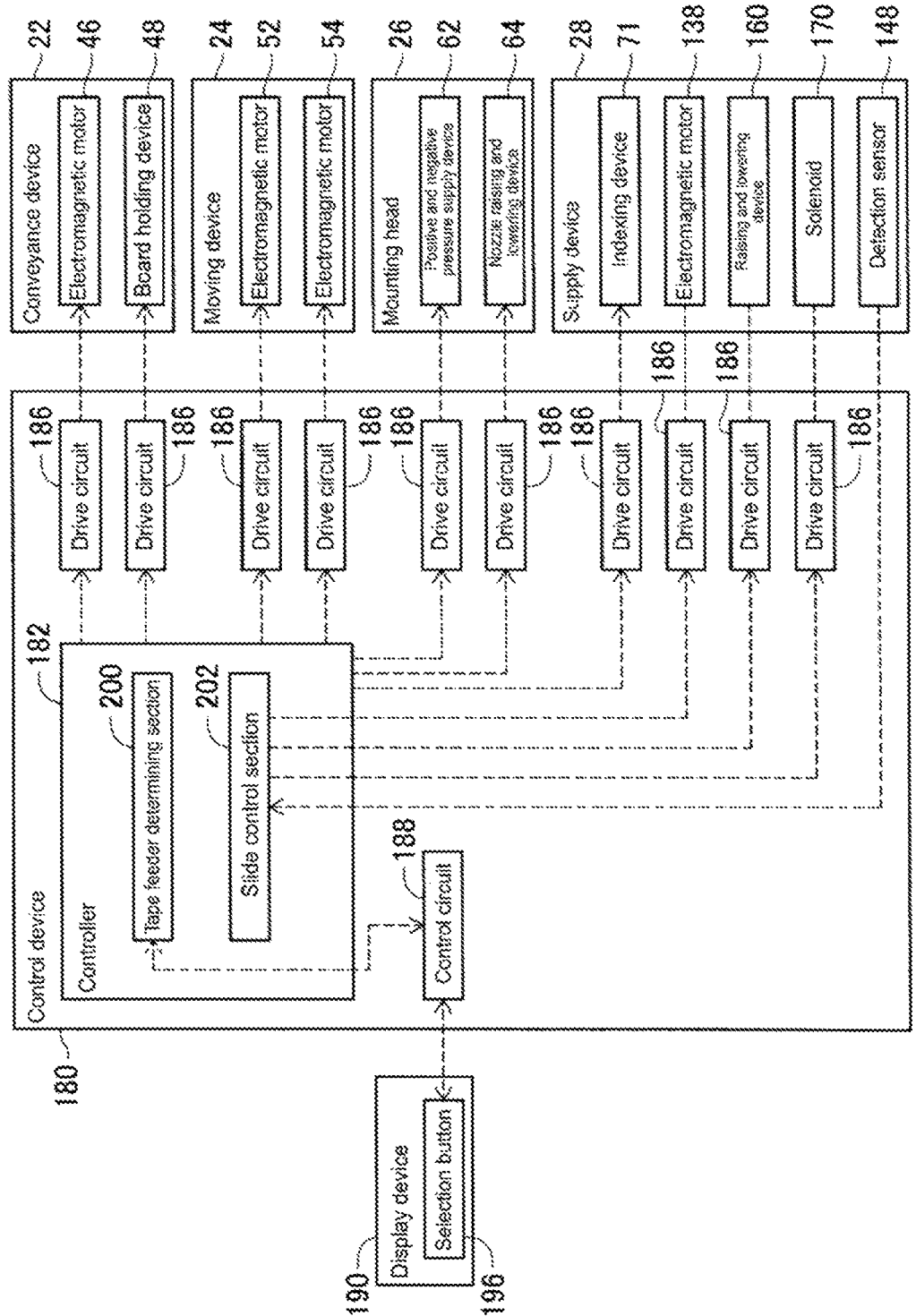
FIG. 11 is a block diagram showing a control device.

Also, mounter 16, as shown in FIG. 11, is provided with control device 180. Control device 180 is provided with controller 182 and multiple drive circuits 186. The multiple drive circuits 186 are connected to the above electromagnetic motors 46, 52, 54, and 138, board holding device 48, positive and negative pressure supply device 62, nozzle raising and lowering device 64, indexing device 71, raising and lowering device 160, and solenoid 170. Controller 182 is provided with a CPU, ROM, RAM, and so on, is formed mainly from a computer, and is connected to the multiple drive circuits 186. By this, operation of conveyance device 22, moving device 24, and so on is controlled by controller 182.

Further, detection sensor 148 is connected to controller 182. By this, a detection signal of tape feeder 70 is inputted. Further, display device 190 is connected to controller 182 via control circuit 188. Display device 190 displays information related to work by mounter 16, specifically, information and the like related to exchange work of tape feeders 70, which is described in detail below, with the display device being a touchscreen type. Note that, selection button 196 is displayed on displace device 190, and an operation result of selection button 196 is inputted to controller 182.

Mounting Work by the Mounter

It is possible to perform mounting work with respect to a circuit board held in conveyance device 22 using mounting head 26 in mounter 16 with the above configuration. Specifically, based on commands of controller 182, the circuit board is conveyed to a work position, and fixedly held at that position. In addition, based on commands of controller 182, tape feeder 70 feeds the taped components, and supplies an electronic component at the supply position. Then, mounting head 26 moves above the supply position of the electronic component and picks up and holds the electronic component using suction nozzle 60. Continuing, mounting head 26 moves above the circuit board and mounts the held electronic component on the circuit board.

Exchange of a tape feeder in accordance with change in the type of the circuit board With mounter 16, mounting work of mounting electronic components on a circuit board is performed as described above, and it is possible to perform mounting work on various types of circuit boards. That is, it is possible to change the type of circuit board and perform mounting work with a different type of circuit board. Specifically, for example, after finishing a first set of mounting work for mounting a first to fourth electronic component on a first circuit board, it is possible to perform a second set of mounting work of mounting third to sixth electronic components on a second circuit board that is different to the first circuit board.

Note that, the first to sixth electronic components are six housed taped components 72 and are wound around tape reels 84 of first to sixth tape feeders 70. Further, before performing the first set of mounting work, first to fourth tape feeders 70 are lined up adjacently in number order, and attached to tape feeder holding device 100. With mounter 16, when the type of the circuit board is changed, from the first to fourth tape feeders 70 attached to tape feeder holding device 100, tape feeders 70 housing electronic components not required for work after the change in the circuit board are displayed on display device 190. Also, tape feeders 70 housing electronic components required for work after the change in the circuit board are displayed on display device 190.

Specifically, for example, in a case in which the circuit board that is the target for mounting work is changed from the first circuit board to the second circuit board, first and second tape feeders 70 housing first and second electronic components not required in the second set of mounting work are determined by tape feeder determining section 200 (refer to FIG. 11) on controller 182 as tape feeders 70 that should be removed from tape feeder holding device 100. Also, those determined first and second tape feeders 70 are displayed on display device 190 as tape feeders to be removed; also displayed is selection button 196 for selecting one of those first and second tape feeders 70.

Then, by an operator selecting the tape feeder to be removed using displayed selection button 196, operation of sliding device 130 and so on corresponding to the selected tape feeder 70 is controlled by slide control section 202 (refer to FIG. 11) of controller 182. By this, the selected tape feeder 70 is slid to the removal position, and the tape feeder 70 slid to the removal position is removed from tape feeder holding device 100 by the operator.

As well as tape feeders to be removed, tape feeders to be attached are displayed on display device 190. That is, in a case in which the circuit board that is the target for mounting work is changed from the first circuit board to the second circuit board, first and second tape feeders 70 housing fifth and sixth electronic components required in the second set of mounting work are determined by tape feeder determining section 200 as tape feeders 70 that should be attached to tape feeder holding device 100. Then, those determined fifth and sixth tape feeders 70 are displayed on display device 190 as tape feeders to be attached.

Then, the operator sets the tape feeder displayed as the target on slide section 102, and by setting it to the removal position, operation of the sliding device 130 and so on corresponding to the set tape feeder 70 is controlled by slide control section 202 of controller 182. By this, tape feeder 70 set at the removal position is slid to the supply position and that tape feeder 70 is attached to tape feeder holding device 100.

In this manner, with mounter 16, by operating selection button 196 and setting a tape feeder 70 at the removal position according to the contents displayed on display device 196, it is possible to attach and remove the tape feeder 70 based on the circuit board that is the target for mounting work to and from tape feeder holding device 100.

Note that, tape feeder 70 is an example of a tape feeder. Carrier tape 74 is an example of tape. Tape feeder holding device 100 is an example of a tape feeder holding device. Slide section 102 is an example of a slide section. Sliding device 130 is an example of a sliding device and a separation direction sliding device. Rack 132 is an example of an effector member. Electromagnetic motor 138 is an example of an actuator. Solenoid 170 is an example of a position regulating section and a stopper.

Further, the present disclosure is not limited to the above example embodiments, and various changed or improved methods of embodiment are possible based on the knowledge of someone skilled in the art. Specifically, for example, in the above embodiment, a stepping motor is used as a motor for sliding tape feeder 70, however, various electromagnetic motors such as a DC motor may be used. In the case of using a DC motor or the like, it will be necessary to control operation of the DC motor based on the slide amount or the like of tape feeder 70 using an encoder or the like.

Also, as a member for contacting tape feeder 70 and sliding tape feeder 70, rack 132 that engages with tape feeder 70 is used, but it is possible to use a pushing pressure member that slides tape feeder 70 by pushing pressure.

Also, as an actuator for sliding tape feeder 70, not only an electromagnetic motor, but also various other actuators may be used, such as a piston or the like that uses a solenoid or oil pressure or the like.

Also, a stopper is used as a member for positioning tape feeder 70 at the removal position, but, for example, a device or the like that automatically slides a tape feeder 70, which is loaded by the operator to be held by slide section 102 before the removal position, to the removal position may be used. That is, when tape feeder 70 is attached to tape feeder holding device 100, the tape feeder 70 may be slid to the removal position by that device, and may be slid from the removal position to the supply position by sliding device 130.

Also, with the above embodiment, tape feeder 70 slid to the removal position by operation of sliding device 130 is removed from tape feeder holding device 100 by an operator, but it is not necessary to remove the tape feeder 70 from tape feeder holding device 100. That is, splicing work, reel exchange work, or the like, may be performed on a tape feeder 70 at the removal position or a tape feeder 70 slid in the separation direction from the removal position. Also, a tape feeder 70 on which work is complete may be slid to the supply position by operation of sliding device 130 and so on.

Also, in the above embodiment, tape feeder holding device 100 is fixedly provided on the end section of the front of frame section 32, however, the tape feeding holding section may be provided to be attachable and detachable with respect to frame section 32.

Also, in the above embodiment, tape feeder holding device 100 is provided with vertical surface section 106, however, the present disclosure may also be applied to a tape feeder holding device not equipped with a vertical surface section, and may be a tape feeder holding device with a connector section provided at a location different to the vertical surface section.

Also, in the above embodiment, for tape feeder determining section 200, tape feeders housing electronic components according to the next work are determined as tape feeders to be attached or removed to or from tape feeder holding device 100, but tape feeders to be attached or removed may be determined by various methods. Specifically, for example, tape feeders for which the quantity of housed electronic components is equal to or less than a specified quantity, may be determined as tape feeders to be removed from tape feeder holding device 100. Also, tape feeders for which maintenance is required, for example, tape feeders for which some kind of trouble has occurred, may be determined as tape feeders to be removed from tape feeder holding device 100.

Also, regardless of the determination of tape feeder determining section 200, tape feeders to be removed from tape feeder holding device 100 may be selected according to the will of an operator, and selected tape feeders may be attached to or removed from tape feeder holding device by operation of sliding device 130.

REFERENCE SIGNS LIST

70: tape feeder; 74: carrier tape (tape); 100: tape feeder holding device; 102: slide section; 130: sliding device (separation direction sliding device); 132: rack (effector member); 138: electromagnetic motor (actuator); 170: solenoid (position regulating section) (stopper)

The invention claimed is:

1. A tape feeder holding device, comprising:
   a slide section on which a tape feeder can be slid, the tape feeder supplying electronic components by feeding tape housing the electronic components in a tape feeding direction;
   a position regulating section including a protrusion that protrudes from a vertical wall of the tape feeding holding device, the position regulating section configured to position the tape feeder at a specified position on the slide section determined by the protrusion abutting the tape feeder;
   a sliding device including a rack that includes a protruding section configured to engage with an engaging hole on a lower surface of the tape feeder, the sliding device configured to slide the tape feeder held in the slide section from the specified position to a supply position at which the electronic components can be supplied from the tape feeder; and
   a control device configured to
      move the position regulating section to protrude the protrusion a predetermined distance to position the tape feeder at the specified position by abutting the protrusion,
      move the rack to align the protruding section and the engagement hole of the tape feeder positioned at the specified position,
      raise the protruding section to engage with the engagement hole, and
      move the tape feeder to the supply position with the sliding device.

2. The tape feeder holding device according to claim 1, wherein
   the sliding device is provided with an actuator that moves the rack along the slide section, and
   the actuator is configured to vary the movement amount of the rack.

3. The tape feeder holding device according to claim 1, wherein
   the protrusion is a stopper configured to regulate the sliding in the tape feeding direction of the tape feeder that is in a state not contacting the rack.

4. The tape feeder holding device according to claim 3, wherein
   the sliding device slides the tape feeder in a state contacting the rack to the supply position after regulation of the sliding by the stopper has been released.

5. The tape feeder holding device according to claim 1, further provided with
   a separation direction sliding device configured to slide the tape feeder positioned at the supply position in a direction separating from the supply position.

6. The tape feeder holding device according to claim 5, wherein
   the separation direction sliding device and the sliding device are the same device.

7. The tape feeder holding device according to claim 2, wherein
   the sliding device includes a transmission that selectively engages the actuator to the rack.

* * * * *